(12) United States Patent
Hsiao et al.

(10) Patent No.: US 9,564,487 B2
(45) Date of Patent: Feb. 7, 2017

(54) DUAL VERTICAL CHANNEL

(71) Applicant: Taiwan Semiconductor Manufacturing Company Limited, Hsin-Chu (TW)

(72) Inventors: Ru-Shang Hsiao, Jhubei (TW); Chia-Ming Chang, Tainan (TW); Huang Jiun-Jie, Kaohsiung (TW); Ling-Sung Wang, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 14/180,394

(22) Filed: Feb. 14, 2014

(65) Prior Publication Data
US 2015/0236094 A1 Aug. 20, 2015

(51) Int. Cl.
| | |
|---|---|
| *H01L 29/10* | (2006.01) |
| *H01L 29/78* | (2006.01) |
| *H01L 29/66* | (2006.01) |
| *H01L 29/08* | (2006.01) |

(52) U.S. Cl.
CPC ..... *H01L 29/1033* (2013.01); *H01L 29/66666* (2013.01); *H01L 29/7827* (2013.01); *H01L 29/0847* (2013.01)

(58) Field of Classification Search
CPC ............ H01L 27/11273; H01L 27/2454; H01L 29/66666; H01L 29/66712; H01L 29/66787; H01L 29/7827; H01L 29/7831; H01L 29/7832
See application file for complete search history.

(56) References Cited

U.S. PATENT DOCUMENTS

| | | | |
|---|---|---|---|
| 9,087,897 B1 * | 7/2015 | Anderson | ........... H01L 29/7827 |
| 2005/0051825 A1 * | 3/2005 | Fujiwara | ........... H01L 29/41733 257/308 |
| 2012/0241826 A1 * | 9/2012 | Satoh | .................... H01L 27/228 257/295 |

* cited by examiner

*Primary Examiner* — Thanhha Pham
(74) *Attorney, Agent, or Firm* — Cooper Legal Group, LLC

(57) ABSTRACT

Among other things, one or more semiconductor arrangements and techniques for forming such semiconductor arrangements are provided herein. A semiconductor arrangement comprises a first channel region and a second channel region that are formed according to at least one of a vertical channel configuration or a dual channel configuration. The first channel region operates as a first channel between a source region and a drain region of the semiconductor arrangement. The second channel region operates as a second channel between the source region and the drain region. A gate region, formed between the first channel region and the second channel region, operates to control the first channel and the second channel. Performance of the semiconductor arrangement is improved, such as an increase in current, because two current paths between the source region and the drain region are provided by the two channels.

20 Claims, 9 Drawing Sheets

DUAL VERTICAL CHANNEL

BACKGROUND

Many semiconductor arrangements comprise switching elements, such as transistors. A transistor comprises a source region, a drain region, and a channel region between the source region and the drain region. The transistor comprises a gate region that controls the channel region to operate the transistor. In an example, responsive to a sufficient voltage being applied to the gate region, current flows through the channel region from the source region to the drain region. The transistor is generally regarded as being switched to an "on" state when current flows through the channel region and in an "off" state when little to no current flows through the channel region.

DETAILED DESCRIPTION

Figure 1:
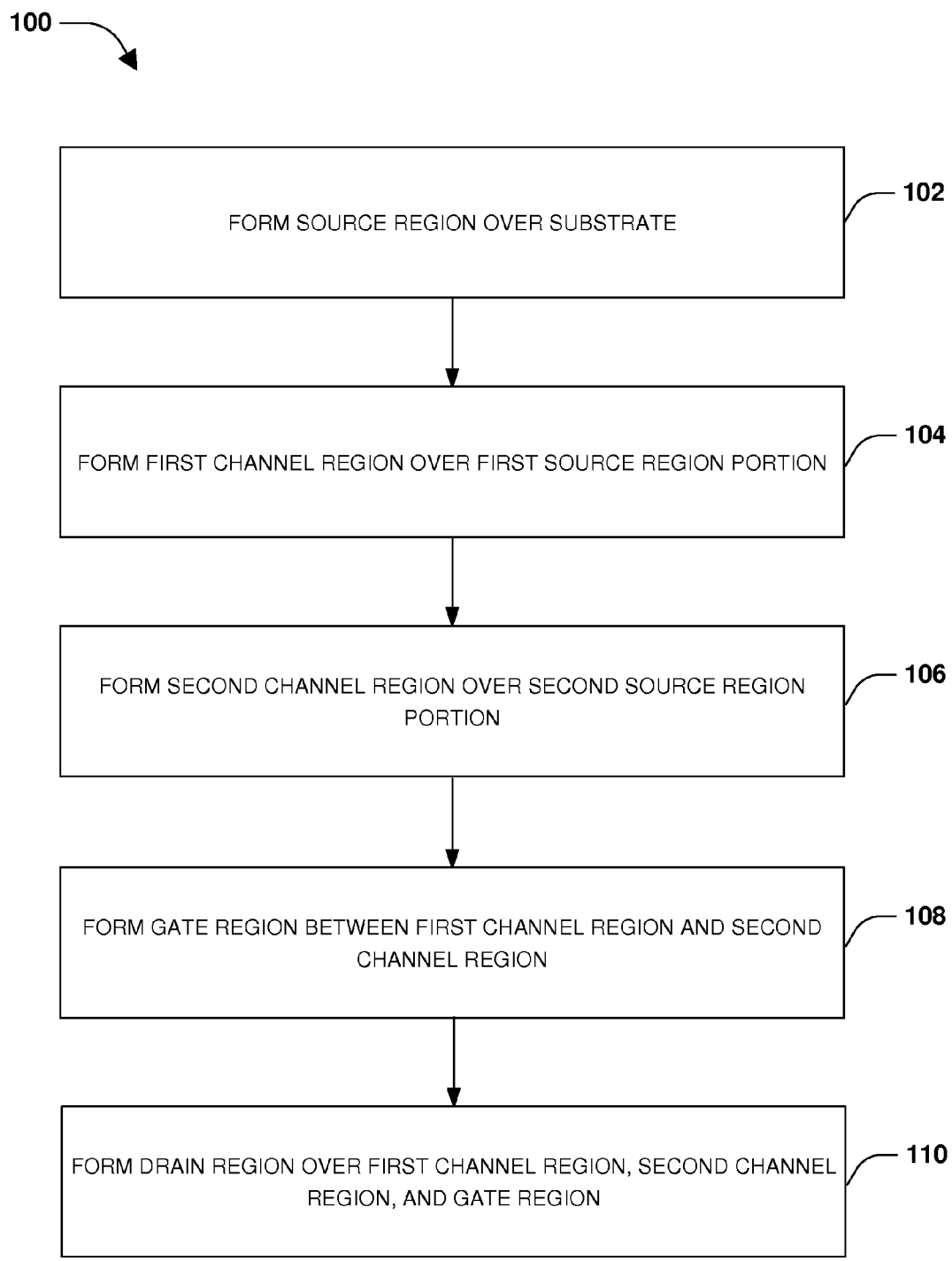
FIG. 1 is a flow diagram illustrating a method of forming a semiconductor arrangement, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

One or more semiconductor arrangements and techniques for forming such semiconductor arrangements are provided. In some embodiments, a semiconductor arrangement comprises one or more channel regions formed according to at least one of a dual channel configuration, such as a dual channel, or a vertical channel configuration, such as a vertical channel. The dual channel comprises a first channel region and a second channel region. In some embodiments, the first channel region and the second channel region are formed according to the vertical channel configuration such that current flows in a vertical direction between a source region and a drain region of the semiconductor arrangement, such as away from or towards a substrate upon which the semiconductor arrangement is formed. The semiconductor arrangement comprises a gate region that is formed between the first channel region and the second channel region. The first channel region, the gate region, and the second channel region are formed between the source region and the drain region. Performance of the semiconductor arrangement is improved, such as an increase in current corresponding to a 1.5× device performance increase, because a channel width of the semiconductor arrangement is increased due to the multiple channel regions providing multiple current paths between the source region and the drain region.

Figure 2:
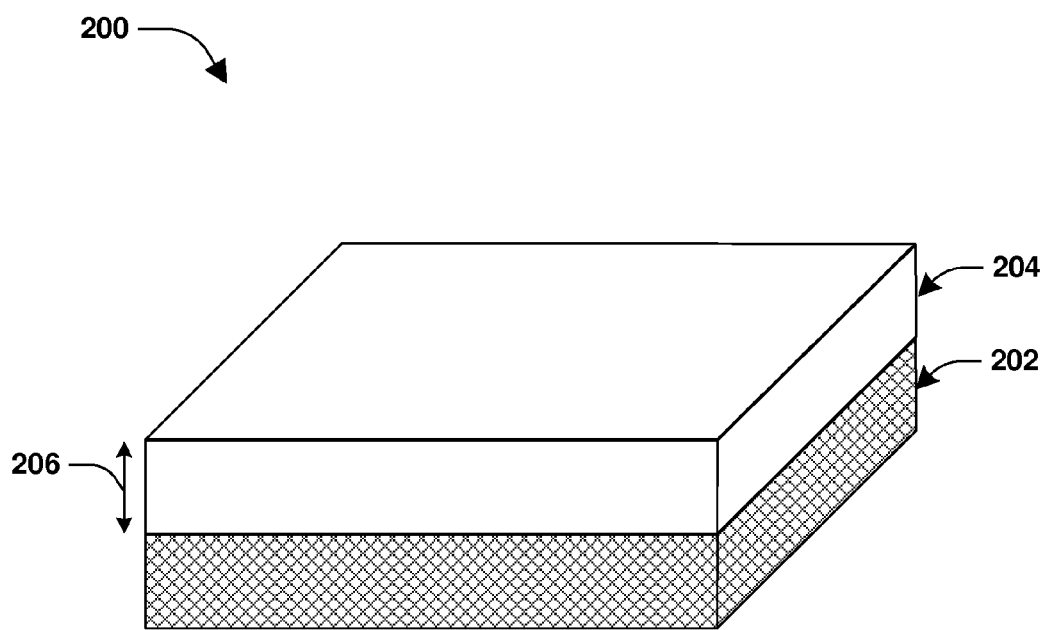
FIG. 2 is an illustration of a semiconductor arrangement comprising a source region, in accordance with some embodiments.

A method 100 of forming a semiconductor arrangement is illustrated in FIG. 1, and one or more semiconductor arrangements formed by such a methodology are illustrated in FIGS. 2-8. At 102, a source region 204 is formed over a substrate 202 of a semiconductor arrangement 200, as illustrated in FIG. 2. In some embodiments, the source region 204 is formed by a deposition process, such as a chemical vapor deposition (CVD) process. In some embodiments, the source region 204 is doped with either n-type dopants or p-type dopants. In some embodiments, the source region 204 has a source region thickness 206 between about 25 nm to about 75 nm, such as about 50 nm.

Figure 3:
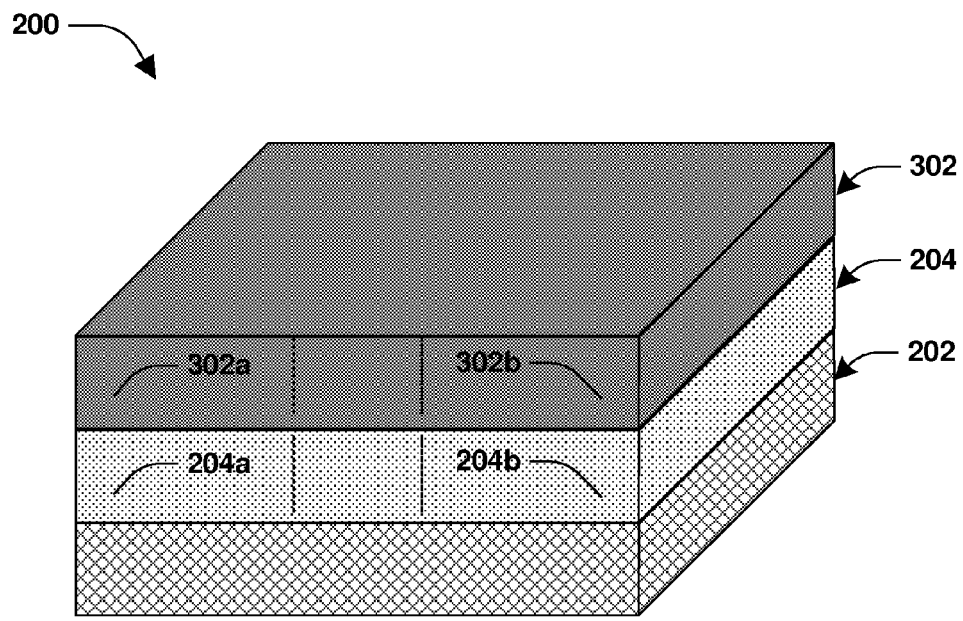
FIG. 3 is an illustration of a semiconductor arrangement comprising a source region, a first channel region, and a second channel region, in accordance with some embodiments.
Figure 4:
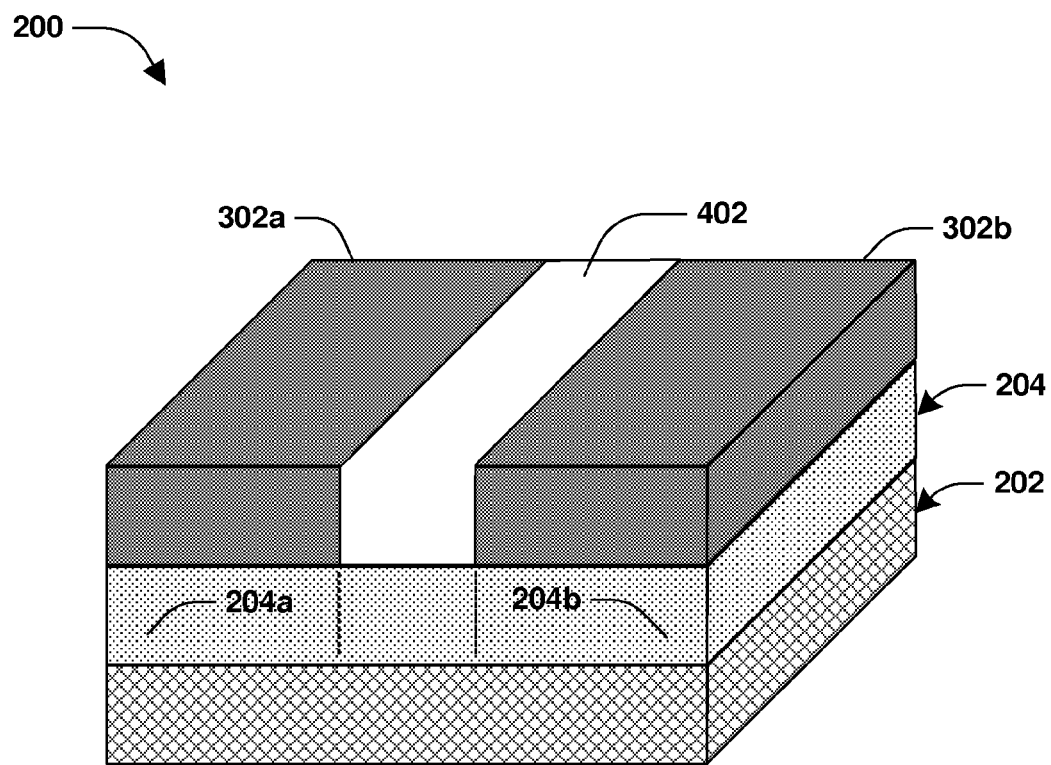
FIG. 4 is an illustration of a semiconductor arrangement comprising a source region, a first channel region, a second channel region, and a gate formation region, in accordance with some embodiments.

In some embodiments, a channel layer 302 is formed over the source region 204, as illustrated in FIG. 3. In some embodiments, a channel having at least one of a dual channel configuration, such as a dual channel, or a vertical channel configuration, such as a vertical channel, is formed from the channel layer 302. At 104, a first channel region 302a is formed over a first source region portion 204a of the source region 204, as illustrated in FIGS. 3 and 4. At 106, a second channel region 302b is formed over a second source region portion 204b of the source region 204, as illustrated in FIGS. 3 and 4. In some embodiments, the first channel region 302a and the second channel region 302b are formed by a film deposition technique for improved control for channel formation.

Figure 5:
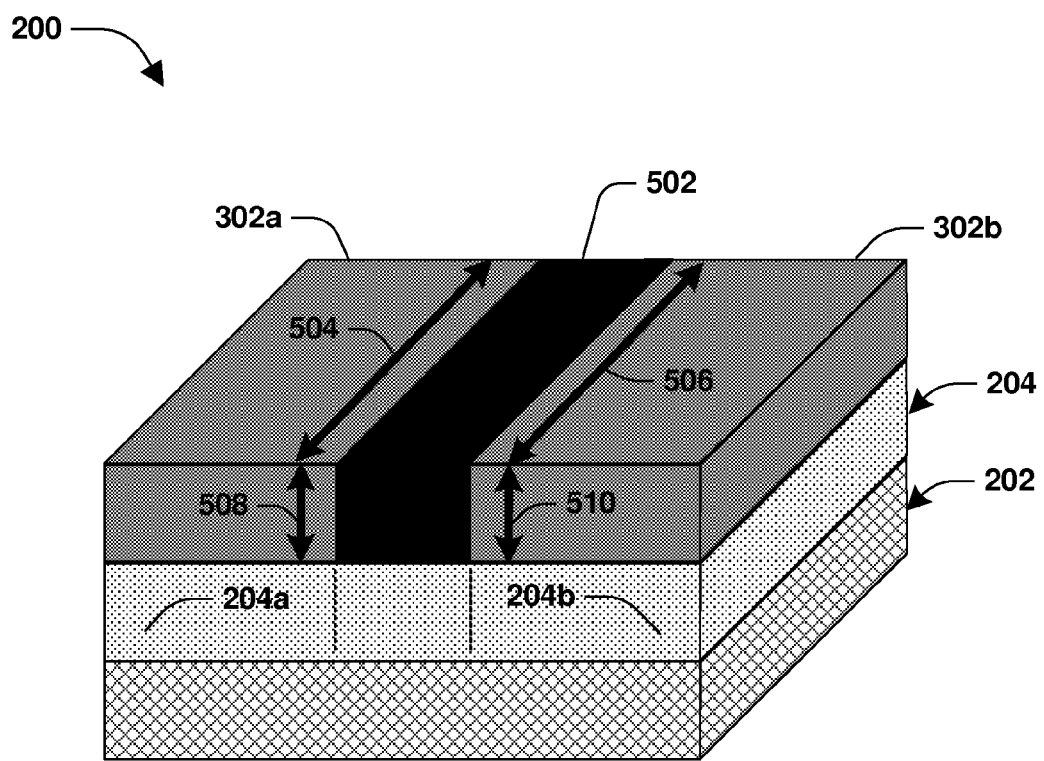
FIG. 5 is an illustration of a semiconductor arrangement comprising a source region, a first channel region, a second channel region, and a gate region, in accordance with some embodiments.

In some embodiments, a portion of the channel layer 302 is removed, such as by a patterning process, to form a gate formation region 402, as illustrated in FIG. 4. At 108, a gate region 502 is formed between the first channel region 302a and the second channel region 302b, as illustrated in FIG. 5. In some embodiments, the gate region 502 is formed over the source region 204. In some embodiments, the gate region 502 is formed by a deposition process. In some embodiments, the gate region 502 comprises polysilicon. In some embodiments, the gate region 502 has a gate region length between about 5 nm to about 45 nm, such as about 20 nm. In some embodiments, the gate region 502 has a gate region height between about 5 nm to about 45 nm, such as about 20 nm. In some embodiments, the gate region 502 has a gate region width between about 500 nm to about 1300 nm, such as about 900 nm.

The first channel region 302a has a first channel region length 508 and the second channel region 302b has a second channel region length 510, as illustrated in FIG. 5. In some embodiments, the first channel region length 508 is substantially equal to the second channel region length 510. In some embodiments, at least one of the first channel region length 508 or the second channel region length 510 have a length between about 5 nm to about 45 nm, such as about 20 nm. The first channel region 302a has a first channel region width 504 and the second channel region 302b has a second channel region width 506, as illustrated in FIG. 5. In some embodiments, the first channel region width 504 is substantially equal to the second channel region width 506. In some embodiments, at least one of the first channel region width 504 or the second channel region width 506 have a width between about 500 nm to about 1300 nm, such as about 900 nm.

Figure 6A:
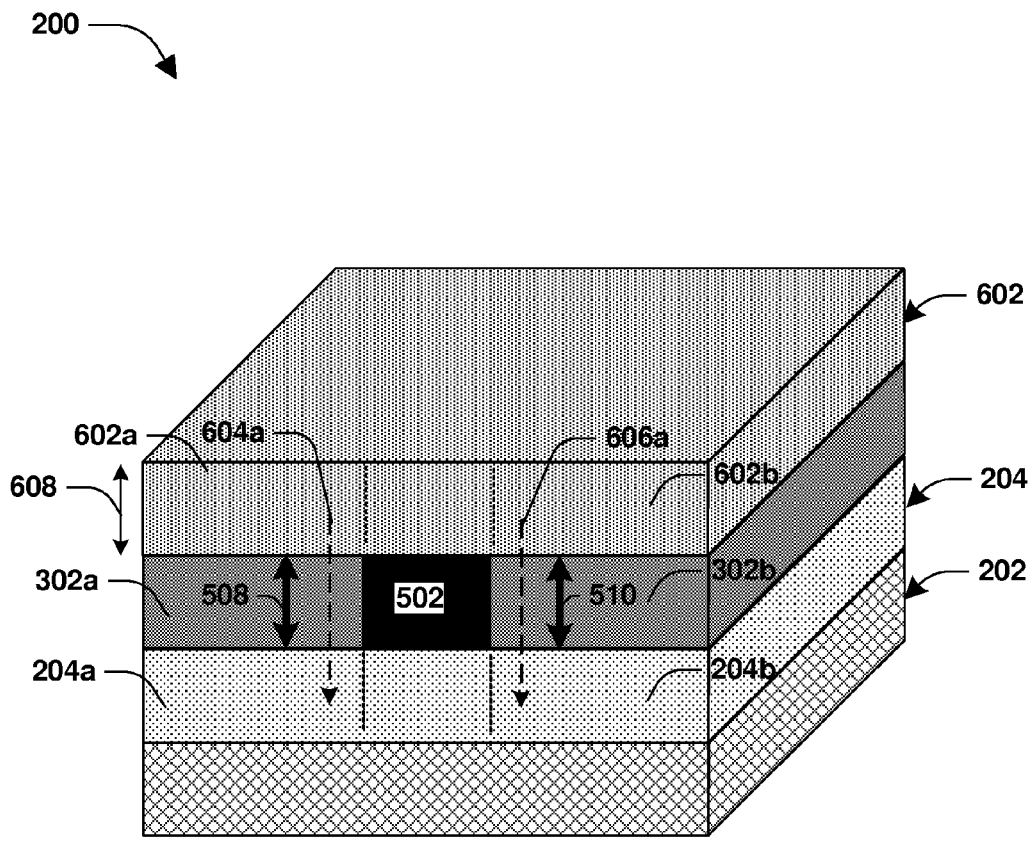
FIG. 6A is an illustration of a semiconductor arrangement comprising a source region, a first channel region, a second channel region, a gate region, and a drain region, in accordance with some embodiments.
Figure 6B:
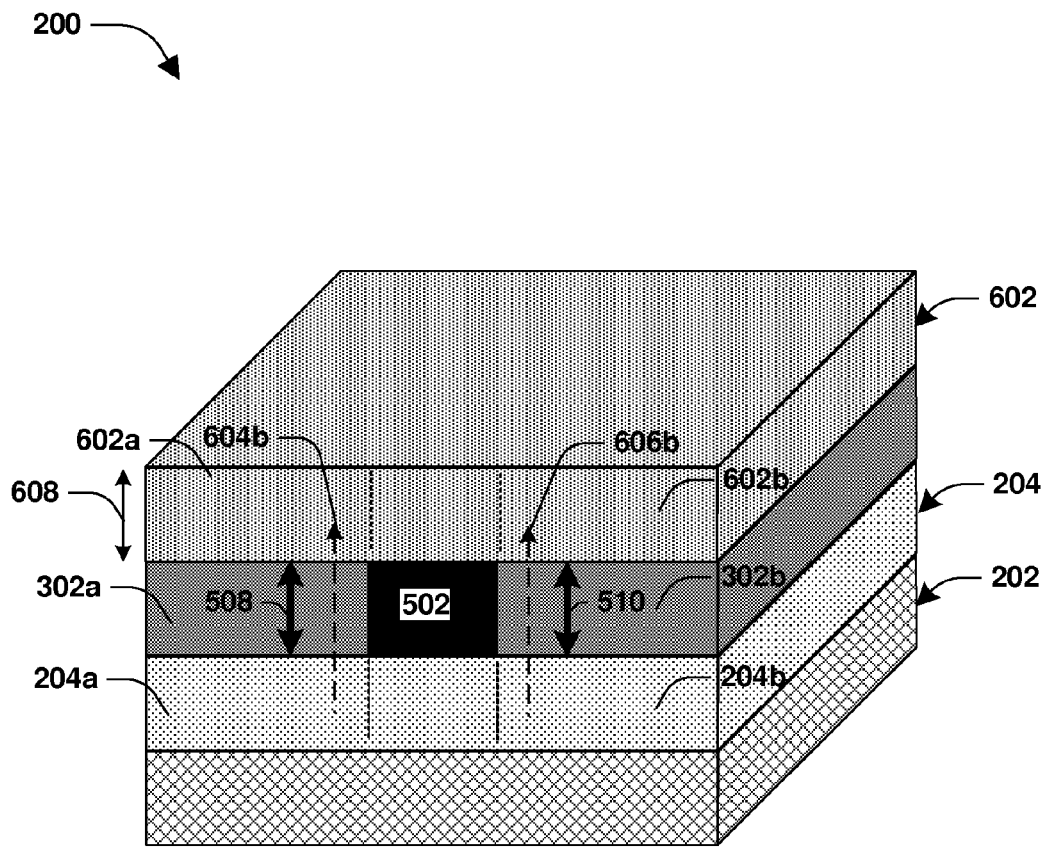
FIG. 6B is an illustration of a semiconductor arrangement comprising a source region, a first channel region, a second channel region, a gate region, and a drain region, in accordance with some embodiments.

At 110, a drain region 602 is formed over the first channel region 302a, the second channel region 302b, and the gate region 502, as illustrated in FIG. 6A. In some embodiments, the drain region 602 has a drain region thickness 608 between about 25 nm to about 75 nm, such as about 50 nm. In some embodiments, a first drain region portion 602a of the drain region 602 is formed over the first channel region 302a and the first source region portion 204a. The first channel region 302a functions as a first channel between the first drain region portion 602a and the first source region portion 204a for the semiconductor arrangement 200. The gate region 502 is configured to control the first channel based upon a voltage applied to the gate region 502. In some embodiments where the semiconductor arrangement 200 is an NMOS device, the gate region 502 turns on the first channel such that current 604a flows through the first channel from the first drain region portion 602a to the first source region portion 204a, as illustrated in FIG. 6A. In some embodiments where the semiconductor arrangement 200 is a PMOS device, the gate region 502 turns on the first channel such that current 604b flows through the first channel from the first source region portion 204a to first drain region portion 602a, as illustrated in FIG. 6B.

In some embodiments, a second drain region portion 602b of the drain region 602 is formed over the second channel region 302b and the second source region portion 204b. The second channel region 302b functions as a second channel between the second drain region portion 602b and the second source region portion 204b for the semiconductor arrangement 200. The gate region 502 is configured to control the second channel based upon a voltage applied to the gate region 502. In some embodiments where the semiconductor arrangement 200 is the NMOS device, the gate region 502 turns on the second channel such that current 606a flows through the second channel from the second drain region portion 602b to the second source region portion 204b, as illustrated in FIG. 6A. In some embodiments where the semiconductor arrangement 200 is the PMOS device, the gate region 502 turns on the second channel such that current 606b flows through the second channel from the second source region portion 204b to the second drain region portion 602b, as illustrated in FIG. 6B. In this way, the first channel region 302a and the second channel region 302b are formed as a dual channel configuration for the semiconductor arrangement 200, such that multiple channels provide current paths between the drain region 602 and the source region 204 for improved performance, such as increase current, for the semiconductor arrangement 200.

Figure 7:
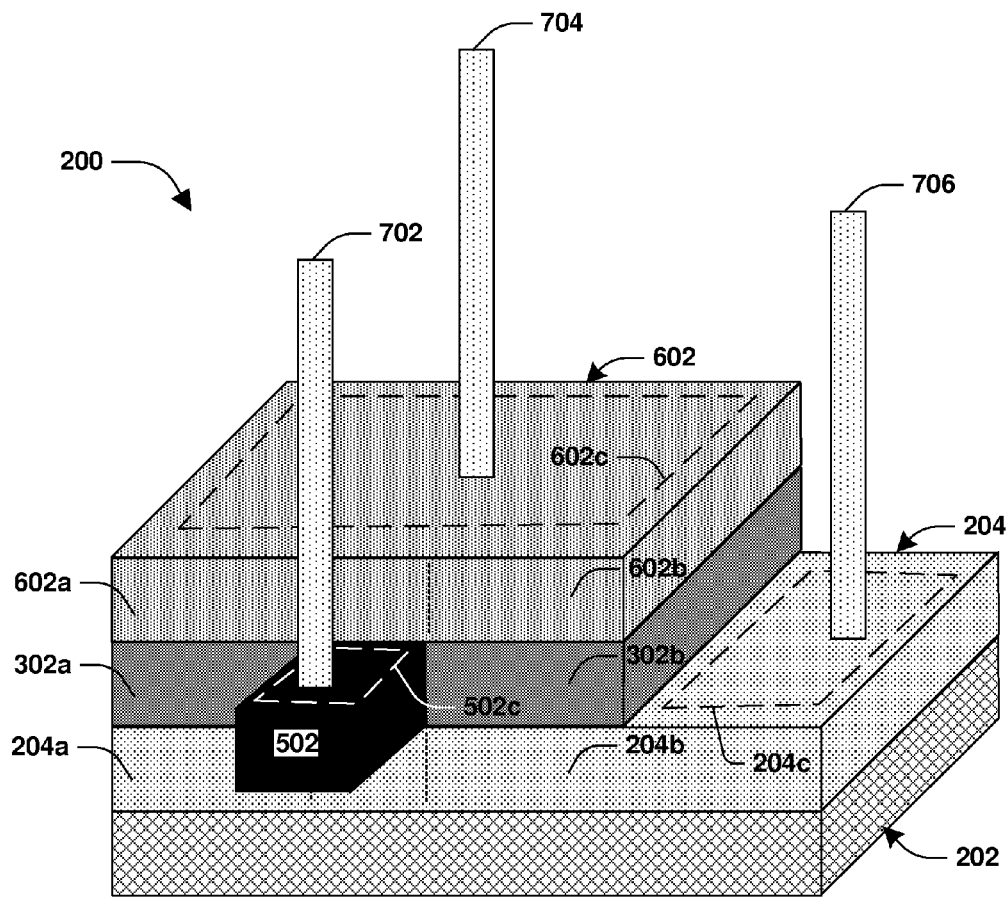
FIG. 7 is an illustration of a semiconductor arrangement comprising a source contact region, a drain contact region, and a gate contact region, in accordance with some embodiments.

In some embodiments, the source region 204 comprises a source contact region 204c coupled to a source contact structure 706, as illustrated in FIG. 7. In some embodiments, the drain region 602, the first channel region 302a, the second channel region 302b, and the gate region 502 are not formed over the source contact region 204c. The source contact structure 706 provides access, such as electrical connectivity, to the source region 204, such as the first source region portion 204a and the second source region portion 204b.

In some embodiments, the gate region 502 comprises a gate contact region 502c coupled to a gate contact structure 702, as illustrated in FIG. 7. In some embodiments, source region 204, the drain region 602, the first channel region 302a, and the second channel region 302b are not formed over the gate contact region 502c. The gate contact structure 702 provides access, such as electrical connectivity, to the gate region 502.

In some embodiments, the drain region 602 comprises a drain contact region 602c coupled to a drain contact structure 704, as illustrated in FIG. 7. In some embodiments, the source region 204, the first channel region 302a, the second channel region 302b, and the gate region 502 are not formed over the drain contact region 602c. The drain contact structure 704 provides access, such as electrical connectivity, to the drain region 602.

Figure 8:
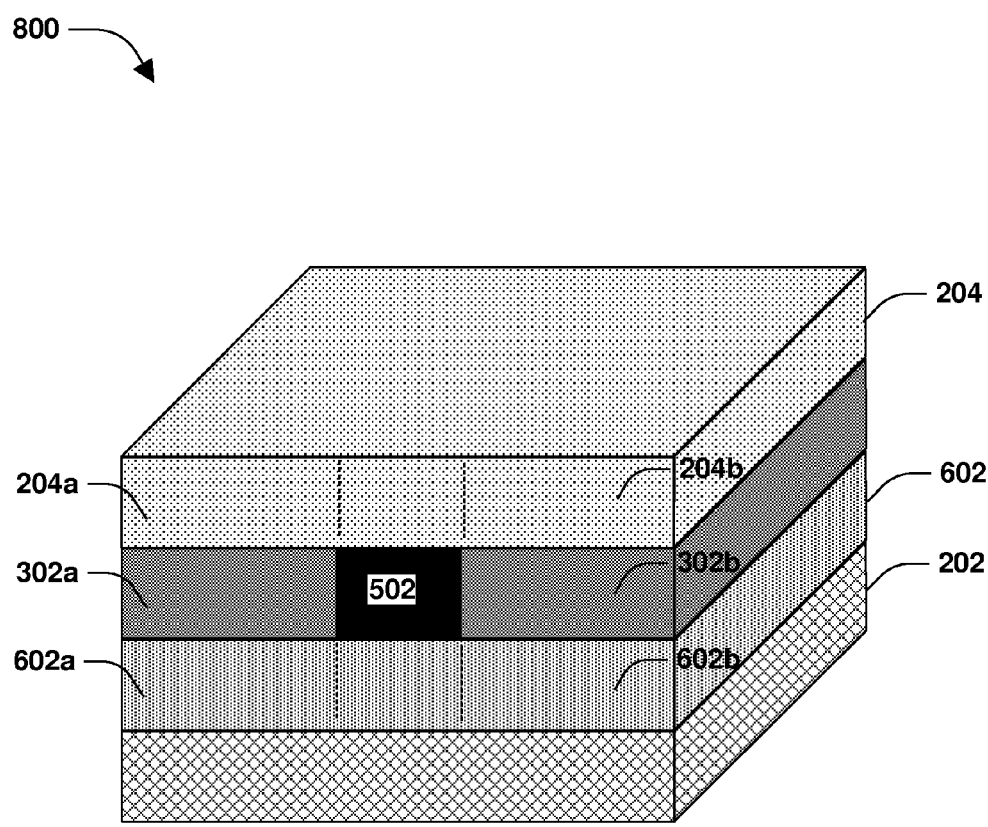
FIG. 8 is an illustration of a semiconductor arrangement comprising a source region, a first channel region, a second channel region, a gate region, and a drain region, in accordance with some embodiments.

It is appreciated that various layer configurations are contemplated herein. In some embodiments, a semiconductor arrangement 800 comprises the drain region 602 formed over the substrate 202, as illustrated in FIG. 8. The first channel region 302a is formed over the first drain region portion 602a of the drain region 602. The second channel region 302b is formed over the second drain region portion 602b of the drain region 602. The gate region 502 is formed over the drain region 602. The gate region 502 is formed between the first channel region 302a and the second channel region 302b. The source region 204 is formed over the first channel region 302a, the second channel region 302b, and the gate region 502. The first source region portion 204a is formed over the first channel region 302a and the first drain region portion 60aa. The second source region portion 204b is formed over the second channel region 302b and the second drain region portion 602b.

Various operations of embodiments are provided herein. In some embodiments, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," and/or the like are not intended to imply a temporal aspect, a spatial aspect, an ordering, etc. Rather, such terms are merely used as identifiers, names, etc. for features, elements, items, etc. For example, a first object and a second object generally correspond to object A and object B or two different or two identical objects or the same object.

Moreover, "exemplary" is used herein to mean serving as an example, instance, illustration, etc., and not necessarily as advantageous. As used herein, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

According to an aspect of the instant disclosure, a semiconductor arrangement comprising a dual channel configuration is provided. The semiconductor arrangement comprises a source region formed over a substrate. The semiconductor arrangement comprises a dual channel. The dual channel comprises a first channel region formed over a first source region portion of the source region. The dual channel comprises a second channel region formed over a second source region portion of the source region. The semiconductor arrangement comprises a gate region formed between the first channel region and the second channel region. The gate region is formed over the source region. The semiconductor arrangement comprises a drain region formed over the dual channel and the gate region.

According to an aspect of the instant disclosure, a semiconductor arrangement comprising a vertical channel configuration is provided. The semiconductor arrangement comprises a drain region formed over a substrate. The semiconductor arrangement comprises a vertical channel. The vertical channel comprises a first channel region formed over a first drain region portion of the drain region. The vertical channel comprises a second channel region formed over a second drain region portion of the drain region. The semiconductor arrangement comprises a gate region formed between the first channel region and the second channel region. The gate region is formed over the drain region. The semiconductor arrangement comprises a source region formed over the vertical channel and the gate region.

According to an aspect of the instant disclosure, a method for forming a semiconductor arrangement is provided. The method comprises forming a source region over a substrate. A first channel region is formed over a first source region portion of the source region. A second channel region is formed over a second source region portion of the source region. A gate region is formed between the first channel region and the second channel region. The gate region is formed over the source region. A drain region is formed over the first channel region, the second channel region, and the gate region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor arrangement comprising a dual channel configuration, comprising:
    a source region having a bottom surface directly contacting a top surface of a substrate;
    a dual channel comprising:
        a first channel region having a bottom surface directly contacting a top surface of a first source region portion of the source region; and
        a second channel region having a bottom surface directly contacting a top surface of a second source region portion of the source region;
    a gate region horizontally between a sidewall of the first channel region and a sidewall of the second channel region, the gate region having a bottom surface directly contacting a top surface of a third source region portion of the source region; and
    a drain region having a bottom surface directly contacting a top surface of the first channel region, a top surface of the second channel region, and a top surface of the gate region.

2. The semiconductor arrangement of claim 1, the first channel region having a first channel region length, the second channel region having a second channel region length, the first channel region length substantially equal to the second channel region length.

3. The semiconductor arrangement of claim 1, the first channel region having a first channel region length, the second channel region having a second channel region length, the first channel region length between about 5 nm to about 45 nm, the second channel region length between about 5 nm to about 45 nm.

4. The semiconductor arrangement of claim 1, the first channel region having a first channel region width, the second channel region having a second channel region width, the first channel region width substantially equal to the second channel region width.

5. The semiconductor arrangement of claim 1, the first channel region having a first channel region width, the second channel region having a second channel region width, the first channel region width between about 500 nm to about 1300 nm, the second channel region width between about 500 nm to about 1300 nm.

6. The semiconductor arrangement of claim 1, the source region having a source region thickness between about 25 nm to about 75 nm.

7. The semiconductor arrangement of claim 1, the drain region having a drain region thickness between about 25 nm to about 75 nm.

8. The semiconductor arrangement of claim 1, the gate region having a gate region length between about 5 nm to about 45 nm.

9. The semiconductor arrangement of claim 1, the source region comprising a source contact region coupled to a source contact structure.

10. The semiconductor arrangement of claim 9, the drain region, the first channel region, the gate region and the second channel region not formed over the source contact region.

11. The semiconductor arrangement of claim 1, the gate region comprising a gate contact region coupled to a gate contact structure.

12. The semiconductor arrangement of claim 11, the source region, the drain region, the first channel region, and the second channel region not formed over the gate contact region.

13. The semiconductor arrangement of claim 1, the drain region comprising a drain contact region coupled to a drain contact structure.

14. The semiconductor arrangement of claim 13, the source region, the gate region, the first channel region, and the second channel region not formed over the drain contact region.

15. A semiconductor arrangement comprising a vertical channel configuration, comprising:
   a drain region having a bottom surface directly contacting a top surface of a substrate;
   a vertical channel comprising:
      a first channel region having a bottom surface directly contacting a top surface of a first drain region portion of the drain region; and
      a second channel region having a bottom surface directly contacting a top surface of a second drain region portion of the drain region;
   a gate region horizontally between a sidewall of the first channel region and a sidewall of the second channel region, the gate region having a bottom surface directly contacting a top surface of a third drain region portion of the drain region; and
   a source region having a bottom surface directly contacting a top surface of the first channel region, a top surface of the second channel region, and a top surface of the gate region.

16. The semiconductor arrangement of claim 15, the source region comprising a source contact region coupled to a source contact structure, the drain region, the first channel region, the gate region and the second channel region not formed over the source contact region.

17. The semiconductor arrangement of claim 15, the gate region comprising a gate contact region coupled to a gate contact structure, the drain region, the source region, the first channel region and the second channel region not formed over the gate contact region.

18. The semiconductor arrangement of claim 15, the drain region comprising a drain contact region coupled to a drain contact structure, the source region, the gate region, the first channel region and the second channel region not formed over the drain contact region.

19. A semiconductor arrangement comprising a vertical channel configuration, comprising:
   a first source/drain region having a bottom surface directly contacting a top surface of a substrate;
   a dual channel comprising:
      a first channel region having a bottom surface directly contacting a top surface of a first source/drain region portion of the first source/drain region; and
      a second channel region having a bottom surface directly contacting a top surface of a second source/drain region portion of the first source/drain region;
   a gate region horizontally coincident with the dual channel and between the first channel region and the second channel region; and
   a second source/drain region having a bottom surface directly contacting a top surface of the gate region and top surfaces of the dual channel, the second source/drain region in contact with the first channel region and the second channel region.

20. The semiconductor arrangement of claim 19, the gate region having a bottom surface that directly contacts a top surface of a third source/drain region portion of the first source/drain region.

* * * * *